(12) United States Patent
Kawai

(10) Patent No.: US 6,373,332 B2
(45) Date of Patent: Apr. 16, 2002

(54) BIQUAD NOTCH FILTER

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 0 days.

(21) Appl. No.: 09/725,357

(22) Filed: Nov. 29, 2000

(30) Foreign Application Priority Data

Dec. 1, 1999 (JP) ............................................. 11-341809

(51) Int. Cl.[7] ................................................. H03K 5/01
(52) U.S. Cl. ........................ 327/556; 327/552; 330/107
(58) Field of Search ................................ 327/552, 553, 327/556, 335; 330/105, 107, 305

(56) References Cited

U.S. PATENT DOCUMENTS 4,057,766 A * 11/1977 Lee ............................. 330/107
4,453,132 A * 6/1984 Stamler ....................... 330/107

* cited by examiner

*Primary Examiner*—Dinh T. Le
(74) *Attorney, Agent, or Firm*—Flynn, Thiel, Boutell & Tanis, P.C.

(57) ABSTRACT

When using an operational amplifier having a small gain-band width product, in order to obtain a circuit having deep notch characteristics, a biquad filter includes first and second stages having inverse amplifiers and third and fourth stages having inverse integrators. Replacing a feed back resistor with an impedance element provides compensation. The compensating impedance element is a reactance, such as an inductor or capacitor connected to the feed back resistor.

10 Claims, 5 Drawing Sheets

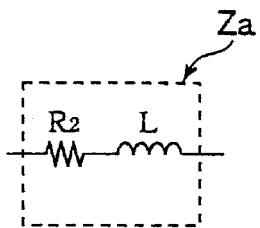
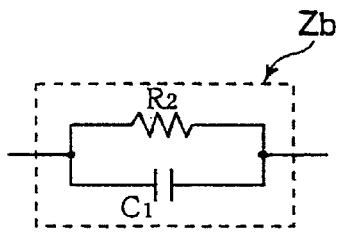
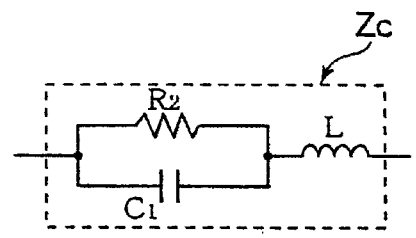
FIG. 4(a)  FIG. 4(b)  FIG. 4(c)
FIG.5
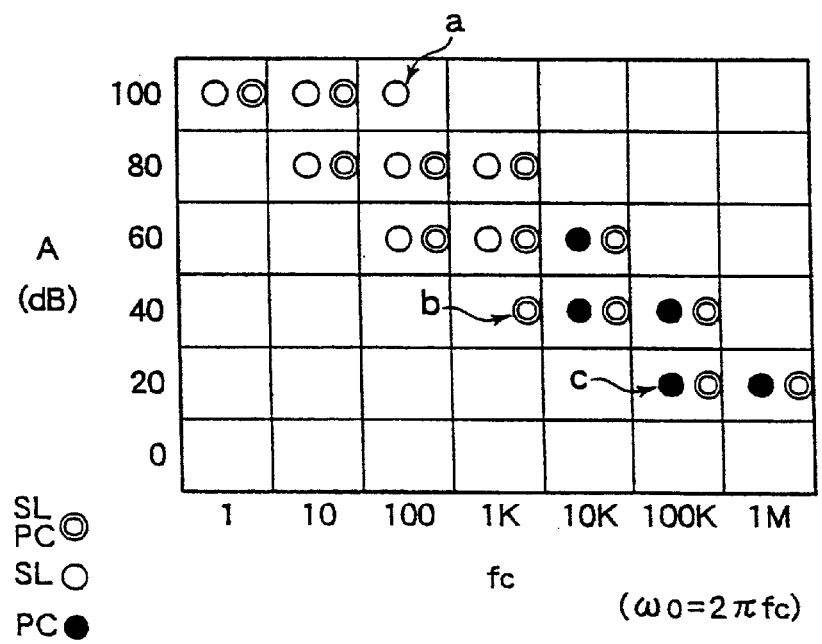
FIG. 5

BIQUAD NOTCH FILTER

FIELD OF THE INVENTION

The present invention relates to a biquad type notch filter acting as an active filter and having a deep notch characteristic.

BACKGROUND OF THE INVENTION

A notch filter is a band elimination filter or a band stop filter, for attenuating or damping a part of a frequency band in a pass-band. There are many types of active filters, however biquad type filters have an easily adjustable characteristic.

A normal type biquad circuit constitutes a first stage as an add-inverse low pass circuit, a second stage as an integrate inverse circuit, a third stage as an inverse circuit, and a feed back circuit from the third stage output to the first stage input. When an output of a notch filter is acquired, it is well known to be obtained using another outer adder weighing three signals, the first stage output and the second stage output or the third stage output, and adding them.

When Q is changed by a notch filter of this type, a gain of the first stage is changed in proportion to Q and simultaneously it may change a weight of a signal added from the first stage output to the outer adder. However, it is troublesome in that the operating level of a following stage circuit is high.

To avoid such trouble, another type of biquad circuit is constituted wherein a first stage is an add-inverse circuit, a second stage is an add-inverse circuit, a third stage is an integrate-inverse circuit and a fourth stage is an integrate-inverse circuit, and feed back circuits are from the third stage output to the first stage input and from the fourth stage output to the second stage input, respectively. When Q changes in this type of biquad circuit, only weight of signal is added an adder of from the first stage output to the second stage input, simultaneously it is changed in proportionate to Q. By this way, not only the circuit is easier than the former circuit is that gains of two stages must be changed, but the latter circuit has no trouble about operating level is high in proportionate to Q. However, the biquad circuit is that the first stage output is notch filter output. When Q enlarges in the circuit, a real operational amplifier (hereinafter, abbreviated "OP amp.") is different from ideal model of this kind and a gain-bandwidth product (GB product) is a finite. Therefore, in many case, a heavy or deep notch is not obtained. When GB product seeks to be enlarged, it is difficult to be given a wide band and a high gain OP amp.

Aim of the present invention provides, according to afore-mentioned, in a biquad notch filter having double feed back circuits, when an OP amp is used. not so large GB product, constituted circuit is obtained having an enough deep notch characteristics.

SUMMARY OF THE INVENTION

In view of the foregoing problems, it is an object of the present invention to provide a biquad notch filter comprising:

a first and a second stages composing an inverse amplifier and a third and a forth stages composing an inverse integrator, a feed back circuit connected from an output of the inverse integrator of the third stage to the inverse amplifier input of the first stage and from an output of the inverse integrator of the forth stage to the inverse amplifier input of the second stage, respectively, said inverse amplifier composed of an operational amplifier and a feed back resistor between input and output of the amplifier, said inverse integrator composed of an operational amplifier and a feed back capacitor between input and output of the amplifier, empowered output of the inverse amplifier of the first stage being a filter output, a reactance element connected to said feed back resistor of said second stage corresponding to a gain and cut off frequency of said inverse amplifier constituted as an impedance element, and obtaining a deep notch characteristic.

The biquad notch filter is preferred wherein the impedance element comprises an inductor connected in series to a feed back resistor of an inverse amplifier of said second stage.

The biquad notch filter is preferred wherein the impedance element comprises a capacitor connected in parallel to a feed back resistor of an inverse amplifier of said second stage.

The biquad notch filter is preferred wherein the impedance element comprises a capacitor connected to a feed back resistor in parallel and an inductor is connected to them in series.

BRIEF DESCRIPTION OF THE DRAWINGS

The objects and features of the present invention will become more apparent from the consideration of the following detailed description taken in conjunction with the accompanying drawings, in which:

FIGS. 4(a)–4(c) are structural circuit diagrams of impedance circuits for compensation using three structural methods of the present invention;

FIG. 5 is a diagram showing relation of open-loop gain and cut-off frequency of OP amp. gained deep notch using a compensator.

DESCRIPTION OF THE PREFERRED EMBODIMENT

A biquad notch filter according to the present invention has first and second stages that are inverse-amplifier circuits and third and fourth stages that are inverse integrator circuits, respectively. When the circuit is used by an OP amp. which has not a large enough GB product, the inverse-amplifier of the second stage constituted by a impedance element includes a reactance element, such as an inductor or a capacitor or the same. Therefore, a deep notch characteristic is obtained.

Figure 1:
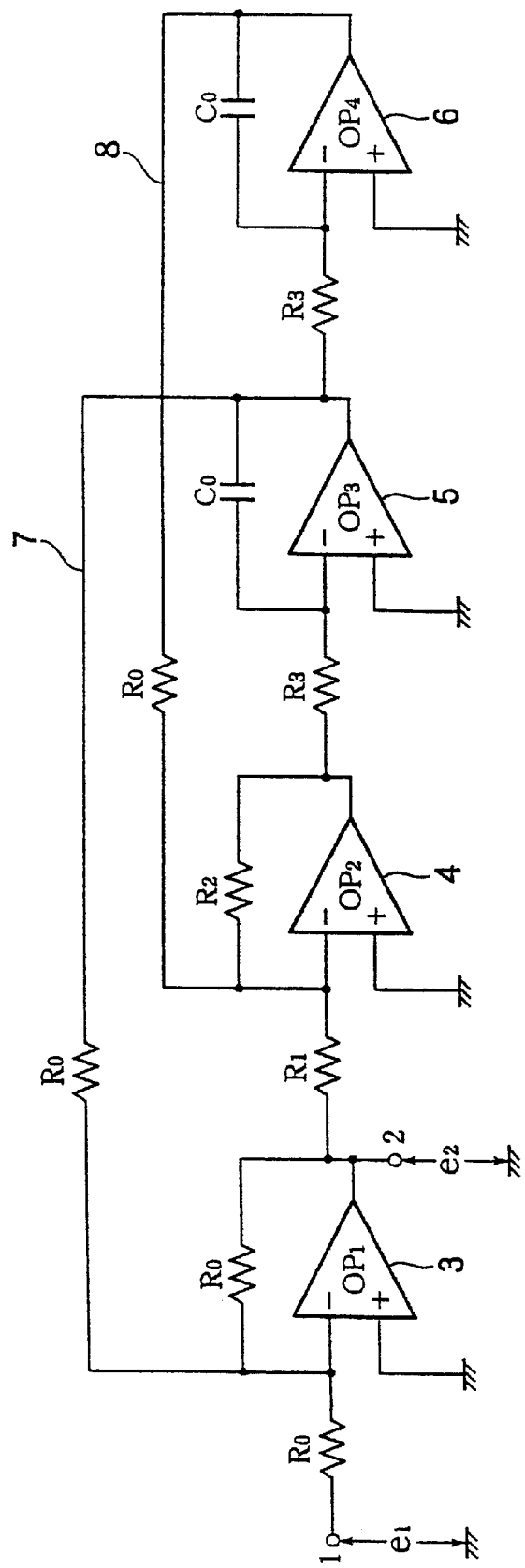
FIG. 1 is a structural circuit diagram of a biquad type notch filter having double feed back circuits used in the present invention.

A detailed description will now be given of an example of a biquad notch filter according to the present invention based on the above-mentioned embodiment. The biquad notch filter shown in FIG. 1 includes a signal input terminal 1, a notch filter output terminal 2, first and second stage inverse-amplifiers 3, 4, and third and fourth stage inverse- integrators 5, 6, respectively. However, using an impedance element selected from any one of three kinds of compensator circuits shown in FIGS. 4(a)–4(c), composed by $R_2$ and another reactance element, when an OP amp. having not so large GB product is used, a circuit is obtained having an extremely deep notch characteristic. FIG. 1 shows resistors $R_0$–$R_3$, a capacitor $C_0$, OP amps. $OP_1$–$OP_4$, an input signal $e_1$, a notch filter output signal $e_2$ and feed back lines or loops 7, 8.

Figure 2B:
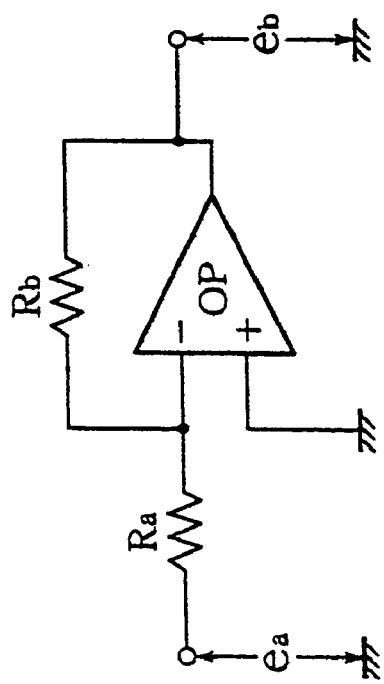
FIG. 2(b) is a structural circuit diagram of a prior art inverse integrator which is a structural component of the circuit of FIG. 1.
Figure 2A:
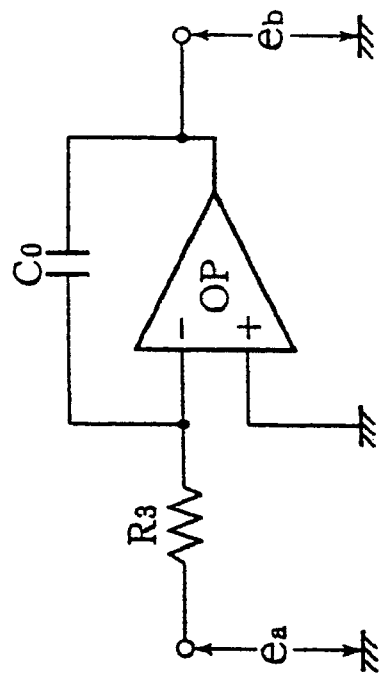
FIG. 2(a) is a structural circuit diagram of an inverse amplifier which is a structural component of the circuit of FIG. 1.

A structural circuit diagram of biquad notch filter of the present invention is quite simple as before mentioned. Its characteristic will be described below. In the circuit shown by FIG. 1, when OP amp. of each circuit is an ideal amplifier, notch frequency $\omega_0$ is defined as $1/(R_3C_0)$ and Q is defined $R_1/R_2$. This circuit is basically a combination of an inverse-amplifier shown in FIG. 2(a) and an inverse-integrator shown in FIG. 2(b). However, when transfer function $H_0(s)$ of OP amp. Itself, as shown by formula 1 is low pass filter of first approximation (open loop gain is A and cut off frequency is $\omega_c$), transfer function $H_A(S)$ of the inverse amplifier shown in FIG. 2(a) is defined as formula 2 and transfer function $H_I(s)$ of the inverse integrator shown in FIG. 2(b) is defined as formula 3.

$$H_0(s) = A\frac{\omega_c}{s+\omega_c} = \frac{GB}{s+\omega_c} \quad (1)$$

$$H_A(s) = \frac{e_b}{e_a} = \frac{A\omega_c \frac{R_b}{R_a+R_b}}{s + \left\{1 + A\frac{R_a}{R_a+R_b}\right\}} \quad (2)$$

$$H_I(s) = \frac{e_d}{e_c} = -\frac{A\omega_0\omega_c}{s^2 + \{\omega_0 + (1+A)\omega_c\}s + \omega_0\omega_c} \quad (3)$$

where $\omega_0 = \frac{1}{R_3C_0}$

Using these transfer functions, if transfer function $H_N(S)$ between terminal 1 and 2 of the circuit shown by FIG. 1 is solved, it is obtained as formula 4 as follows.

$$H_N(s) = \frac{e_2}{e_1} = -\frac{a}{b} \cdot \frac{sedg^2 + cdml^2}{cedg^2 + aeghl + cdml^2} \quad (4)$$

where $a = \frac{A\omega_c}{2}$, $b = s + \frac{A\omega_c}{2}$, $c = s + \left(1 + A\frac{R_1}{R_1+R_2}\right)\omega_c$, $d = s + \left(1 + \frac{A}{2}\right)\omega_0$, $l = A\omega_0\omega_c$, $m = A\omega_c \frac{R_2}{R_0+R_2}$, $e = s + \left(1 + A\frac{R_0}{R_0+R_2}\right)\omega_c$, $g = s^2 + \{\omega_0 + (1+A)\omega_c\}s + \omega_0\omega_c$ and $h = A\omega_0 \frac{R_2}{R_1+R_2}$ In formula 4, as numerator is 7th order and denominator is 8 th order, it is too high order to analyze easily. However, as formula 2 and 3 are first order and second order, respectively, when an OP amp. amplification factor A and a cut off frequency $\omega_c$ are not so large, then it occurs a phase rotating by them. Therefore, it predicts that is not sufficiently noise canceling by inverse amplifier of the first stage shown by FIG. 1.

A position which is compensating the phase rotating is predicted that $R_2$ position is a feed back resistor of second stage shown by FIG. 1 is the optimum position. Since changing impedance of only one position is influenced two feed back loops 7,8, therefore the position is that is in all over the circuit influenced.

Figure 3:
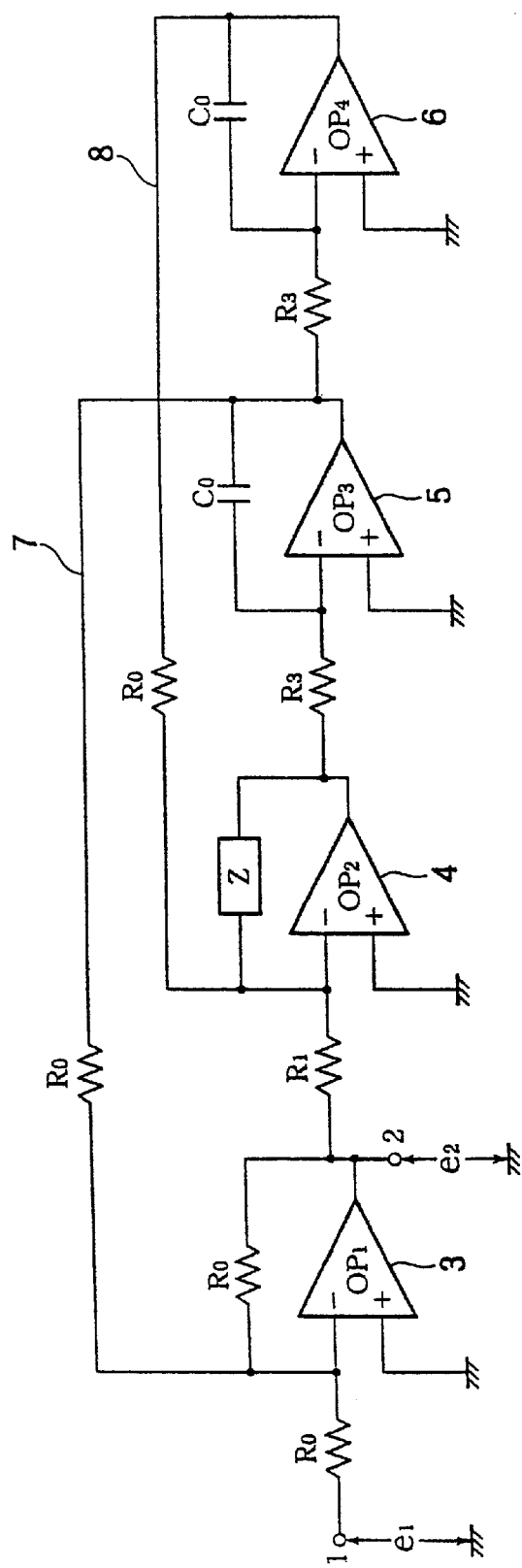
FIG. 3 is a structural circuit diagram of an example of the present invention in which a resistance element is replaced by an impedance circuit for compensation in order to improve a notch characteristic of the circuit in FIG. 1.

A circuit in which $R_2$ is replaced by compensator element of impedance element Z, is shown by FIG. 3. In FIG. 3, three kinds of Zs of inner constitution $Z_a$ to $Z_c$, are shown by FIG. 4(A) to FIG. 4(C). In $Z_a$, an inductor L is connected to a feed back resistor $R_2$ in series, in $Z_b$, a capacitor $C_1$ is connected to $R_2$ in parallel and in $Z_c$, a capacitor $C_1$ is connected $R_2$ in a parallel to $R_2$ and an inductor L is connected to them in series.

By using these three kinds of compensator, it is confirmed by calculation of absolute value in formula 4. Obtained the calculation is shown by FIG. 5.

Longitudinal axis of FIG. 5 is an open loop gain A of OP amp. and transverse axis is a cut off frequency $f_c(\omega_c=2\pi f_c)$ of first approximation low-pass. In FIG. 5, a circle (○) shows that compensating is performed using a $Z_a$, ● shows that compensating is performed using a $Z_b$ and ◎ shows that compensating is performed using a $Z_c$, respectively. A described position on coordinate are A and $f_c$ used as the calculation. Another parameter of calculation about formula 4 are $\omega_0=2\times\pi\times5\times10^3$, $R_0=10^4$, $R_1=4\times10^5$ and $R_2=10^4$. As Q is $R_1/R_4$, so Q is 40.

As shown by FIG. 5, when A is relatively large and f is relatively low, it can compensate by circuit shown by FIG. 4(b). Accordingly, it is approved that by the circuit as shown by FIG. 4(c) obtained in combination of FIGS. 4(a) and (b), in whole limits of OP amp. can compensate.

In examples of calculation, the above ○ shown by FIG. 5 when compensating circuit is not used, input signal of 5 kHz is damped only 26 dB. Most deep notch point arises in 4.9735 kHz, though damping of the point is only 21.316 dB. However, when compensating circuit $Z_a$ is used and L is selected 6.3009 . . . $\times 10^{-4}$ H(Henry), then mostly perfect zero point is produced having a damping factor 170 dB or more at frequency 4.9974 . . . kHz. In the above ● shown by FIG. 5, when there is only keeping $R_2$, it is obtained that a damping factor is only 0.17 dB at the point of frequency 5 kHz, and no notch is produced. However, when compensating circuit $Z_b$ is used, and $C_1$ is selected in 9.02465 . . . $\times 10^{-11}$F, then mostly perfect zero point is produced having a damping factor 100 dB or more at frequency 4.0610455 . . . kHz.

Furthermore, in the above c=◎ shown by FIG. 5, when there is only keeping $R_2$, notch doesn't arise. However, using a compensating circuit $Z_c$ and $C_1$ is selected in 1.20007 . . . $\times 10^{-11}$F and L is selected in 5.683497 . . . $\times 10^{-4}$H, then notch is obtained having a dumping factor 110 dB or more at frequency of 4.70643162 . . . kHz. The compensating circuit $Z_c$ can change both L and $C_1$, so combination of the L and $C_1$ e are infinity. Therefore, it can be corresponding to a combination of A and $\omega_c$ of OP amp. through in high extent limits.

Figure 6:
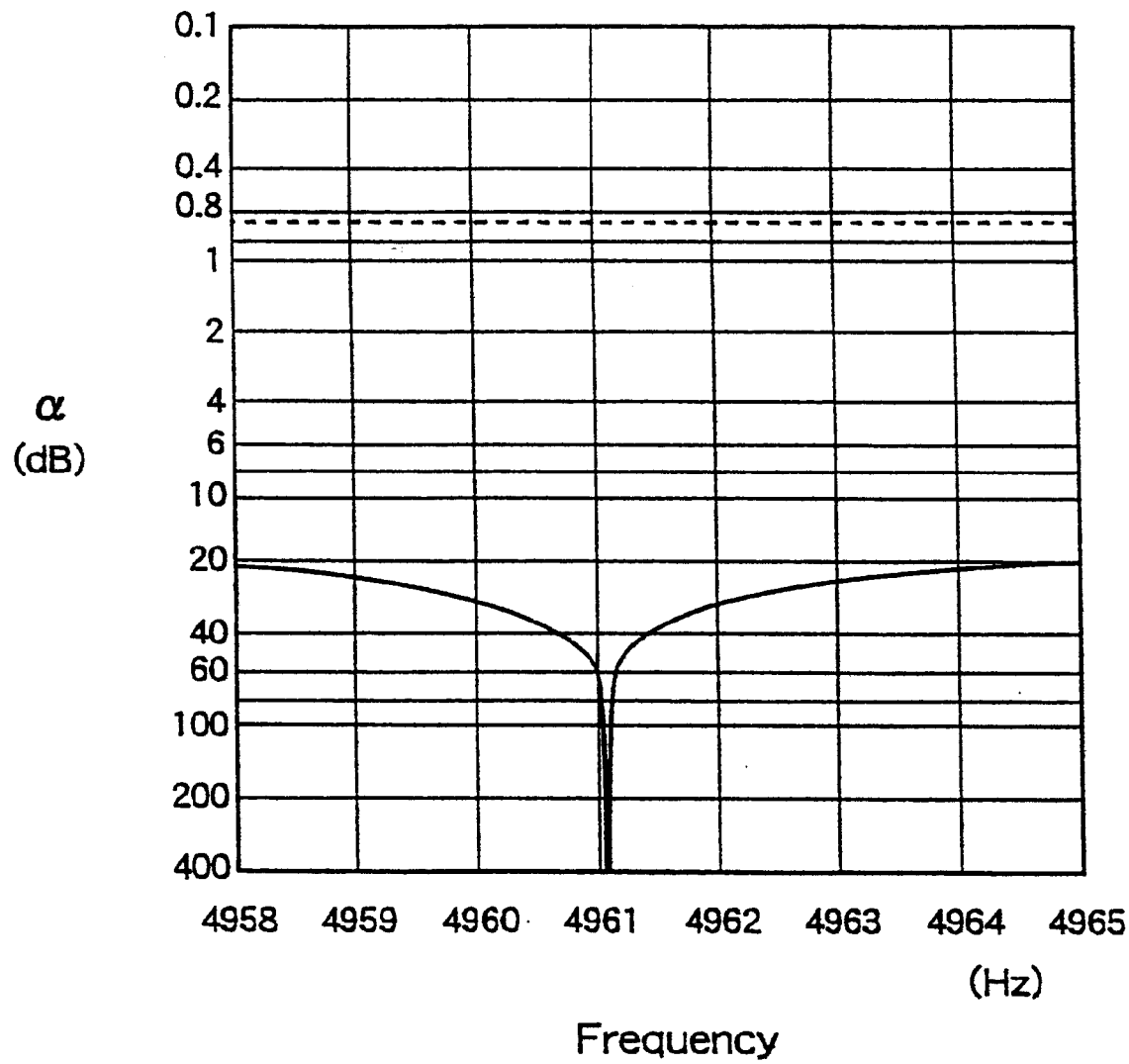
FIG. 6 is a characteristic diagram showing an example of frequency characteristic using a compensator and no compensator.

Furthermore, in an example of using the compensating circuit, when a compensating circuit $Z_b$ is used, obtained characteristic frequency of a dumping factor α is shown by FIG. 6. In FIG. 6, dotted line is that the case of no compensating circuit is used. When a compensating circuit is used, a deep notch characteristic is obtained as shown in a solid line.

As described above, the present invention is to provide a biquad notch filter having double feed back circuit, using an OP amp. not so large GB product, that constituting circuit is given to have enough to a deep notch characteristics. Therefore, a difficulty of selecting OP amp. is expunged.

While the present invention has been described with reference to the particular illustrative embodiments, it is not to be restricted by this embodiment but only by the appended claims. It is to be appreciated that those skilled in the art can change or modify the embodiments without departing from the scope and spirit of the present invention.

What is claimed is:

1. A biquad notch filter comprising:

first and second stages comprising inverse amplifiers and third and fourth stages comprising inverse integrators;

a feed back circuit connected from an output of the inverse integrator of the third stage to an inverse amplifier input of the first stage and a second feed back circuit connected from an output of the inverse integrator of the fourth stage to an inverse amplifier input of the second stage;

said inverse amplifiers each comprising an operational amplifier and a feed back resistor between the inverse amplifier input and an output of the operational amplifier, said inverse integrators each comprising an operational amplifier and a feed back capacitor between an input and the inverse amplifier output of the operational amplifier, said operational amplifier of the inverse amplifier of the first stage providing the inverse amplifier input at an input terminal and providing the output at an output terminal of said biquad notch filter; and the improvement comprising a reactance element connected to said feed back resistor of said second stage comprising an impedance element in accordance with a gain and cut off frequency of said inverse operational amplifier of said second stage to obtain a deep notch characteristic.

2. The biquad notch filter according to claim 1, wherein said impedance element comprises an inductor connected in series to said feed back resistor of said inverse amplifier of said second stage.

3. The biquad notch filter according to claim 1, wherein said impedance element comprises a capacitor connected in parallel to said feed back resistor of said inverse amplifier of said second stage.

4. The biquad notch filter according to claim 1, wherein said impedance element comprises a capacitor connected in parallel to said feed back resistor and an inductor connected in series.

5. A biquad notch filter comprising:

a first stage having a first inverse amplifier, said first inverse amplifier comprising a first operational amplifier with a first stage inverse input terminal, a first stage output terminal, and a first stage feed back resistor connecting the first stage inverse input terminal and the first stage output terminal;

a second stage having a second inverse amplifier, said second inverse amplifier comprising a second operational amplifier with a second stage inverse input terminal connected to the first stage output terminal, a second stage output terminal, and the combination of a second stage feed back resistor and a second stage reactance element connecting the second stage inverse input terminal and the second stage output terminal;

a third stage having a third inverse amplifier, said third inverse amplifier comprising a third operational amplifier with a third stage inverse input terminal connected to the second stage output terminal, a third stage output terminal, and a third stage feed back capacitor connecting the third stage inverse input terminal and the third stage output terminal;

a first feed back circuit connected from the third stage output terminal to the first stage inverse input terminal;

a fourth stage having a fourth inverse amplifier, said fourth inverse amplifier comprising a fourth operational amplifier with a fourth stage inverse input terminal connected to the third stage output terminal, a fourth stage output terminal, and a fourth stage feed back capacitor connecting the fourth stage inverse input terminal and the fourth stage output terminal; and and a second feed back circuit connected from the fourth stage output terminal to the second stage inverse input terminal;

wherein the first stage inverse input terminal comprises a notch filter input terminal and the first stage output terminal comprises a notch filter output terminal.

6. The biquad notch filter of claim 5, wherein the second stage reactance element comprises an inductor connected in series with the second stage feed back resistor.

7. The biquad notch filter of claim 5, wherein the second stage reactance element comprises a capacitor connected in parallel with the second stage feed back resistor.

8. The biquad notch filter of claim 7, wherein the second stage reactance element further comprises an inductor connected in series with the second stage feed back resistor and the capacitor.

9. The biquad notch filter of claim 5, wherein the second stage reactance element and the second stage feed back resistor provide a gain and cut off frequency for said second operation amplifier resulting in a deep notch characteristic.

10. The biquad notch filter of claim 5, wherein positive input terminals of said first, second, third and fourth operational amplifiers are connected to ground.

* * * * *